United States Patent [19]

Sondermeyer

[11] 3,796,967

[45] Mar. 12, 1974

[54] AMPLIFIER PROTECTION CIRCUIT

[75] Inventor: Jack C. Sondermeyer, S. Somerville, N.J.

[73] Assignee: RCA Corporation, New York, N.Y.

[22] Filed: Sept. 19, 1966

[21] Appl. No.: 580,269

[52] U.S. Cl. .................. 330/207 P, 330/15, 330/13, 330/20, 330/24

[51] Int. Cl. ............................................ H03f 27/00

[58] Field of Search .............. 330/11 P, 13; 307/202

[56] References Cited

UNITED STATES PATENTS 3,372,344 3/1968 Hafler .................................. 330/17

3,376,388 4/1968 Reiffin ............................ 330/13 X

*Primary Examiner*—Nathan Kaufman

*Attorney, Agent, or Firm*—Eugene M. Whitacre; Kenneth R. Schaefer

[57] ABSTRACT

A protection circuit for negative feedback amplifier using electronic switch means such as a Zener diode coupled between the amplifier input circuit and the output circuit in a manner to provide a low impedance path from the input circuit to the output circuit when the applied input signal exceeds a particular threshold value.

9 Claims, 2 Drawing Figures

Figure 1:
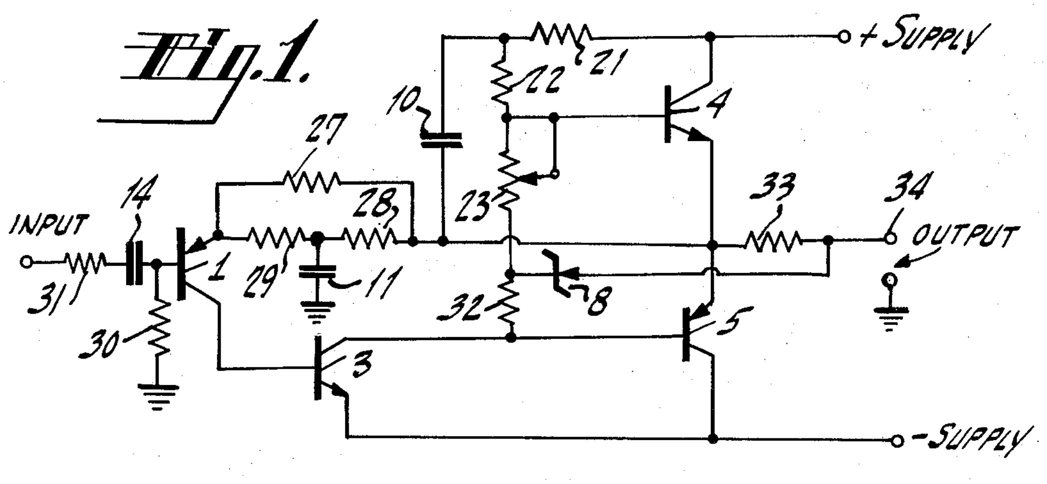

INVENTOR.
JACK C. SONDERMEYER
BY Eugene M. Whitacre
Attorney

AMPLIFIER PROTECTION CIRCUIT

This invention relates to electrical signal amplifiers and in particular to high power transistor amplifiers.

Low output impedance transistor amplifiers may present design problems if the amplifier is to be used with variable loads, low reactance loads, or is subject to incidental short circuits of the output terminals. Under certain conditions, such amplifiers will supply large peak currents to the load or short circuit with consequent increased power dissipation which may destroy the output transistor or transistors.

It is known in the art to design amplifier control circuits to protect power amplifiers against over dissipation by attenuating the drive signal when dissipation becomes excessive. In such designs the control circuit has a time constant in response to overload conditions which may be too slow to protect the output transistor. It is also known to apply bias so as to reduce the average amplifier current and thereby prevent excess dissipation in response to overload conditions. Circuits of this type have not proved to be satisfactory because the change in bias may cause the transistor to operate in a non-linear region, thereby introducing distortion.

It is an object of this invention to provide a simple and effective circuit for overload protection of a transistor amplifier.

Still another object of this invention is to provide overload protection for a transistor power amplifier circuit with a response time shorter than the thermal time constant of the transistors used in the amplifier.

Still another object of this invention is to provide a circuit that limits peak current in the transistor regardless of load or signal input characteristics.

Still another object of this invention is to provide amplifier current limit protection which only limits signal peaks while not affecting the normal amplifier characteristics at lower levels.

A low output impedance transistor amplifier embodying the invention includes means for deriving a voltage indicative of transistor current. When the transistor current exceeds a threshold value, electrical switching means changes the application of the drive signals to the transistor so that the amplifier output circuit is characterized as a constant current rather than a constant voltage source. In this way the amplifier output circuit is of low impedance below the current threshold and of high impedance above this value.

In a specific embodiment of the invention, the overload protection circuit is applied to a complementary or quasi complementary push-pull transistor amplifier. In such a circuit a diode is connected between the amplifier output terminal and a point on the biasing and signal drive network in common with the base electrodes of the complementary transistors. A current sensing resistor is included between the output terminal and at least one of the output electrodes of the transistors. When the output current of the transistors is excessive the diode conducts to clamp the signal drive to the transistors thereby preventing further increase in the output current.

Figure 2:
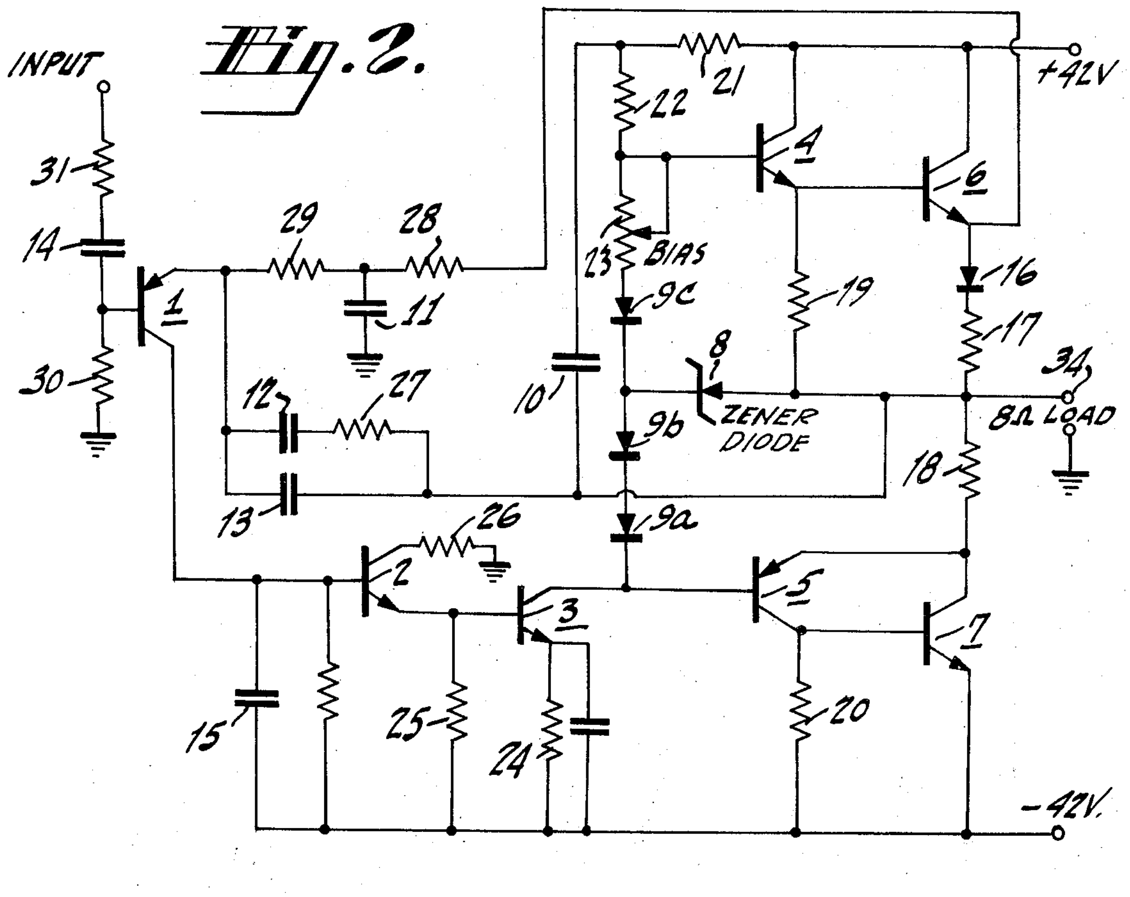

Other objects and features of this invention will become apparent when referring to the following specification in connection with the accompanying drawings in which:

FIG. 1 is a schematic circuit diagram of an amplifier embodying the present invention; and FIG. 2 is a detailed schematic circuit diagram of another amplifier circuit embodying the invention.

The amplifier shown in FIG. 1 is a complementary symmetry type which provides the advantages of wide band response, feedback stabilization of operating point, and minimum cost because transformers and capacitive coupling circuits are unnecessary.

A preamplification stage including a transistor 1 provides signal drive to a driver stage including a transistor 3. The driver stage transistor 3 provides the signal drive to the output stages which include a pair of transistors 4 and 5. The output transistors 4 and 5 are a complementary pair which drive the load through a resistor 33. Direct current feedback through resistors 27,28, 29 to the transistor 1 provide operating point stabilization of the voltage drops across the complementary transistor pair 4 and 5. Resistor 27 also provides negative feedback for the audio signals while capacitor 11 prevents such feedback through resistors 28 and 29. The input coupling network consisting of resistors 31, 30 and the transistor input impedance combined with capacitor 14 determine the low frequency roll-off of the amplifier since the remainder of the amplifier is essentially direct coupled. An additional reduction of very low frequency response is provided when capacitor 11 is no longer an effective bypass and increased negative signal feedback occurs through the resistors 28 and 29.

Resistors 32, 21, 22, 23 comprise a bias network for the output transistor complementary pair 4, 5. Capacitor 10 provides a bootstrap of the bias network 22, 23, and 32 so that when signal drive turns transistor 3 off, a substantially constant current bias is available through resistor 22 for all audio frequencies.

Protection of the output transistors 4 and 5 is achieved by the use of a Zener diode or an avalanche diode 8 connected between the output terminal 34 and the junction of the resistors 23 and 32. The driver transistor 3 provides its drive signal to the output pair 4 and 5 in conjunction with the bias supply resistors 23, and 32. These resistors are typically quite small compared to the input impedance of the output transistors 4 and 5 and thereby provide a voltage drop between the bases of the transistors 4 and 5 to improve the cross-over performance characteristics.

The current drawn by the load coupled between the output terminal 34 and ground causes a voltage to be developed across the resistor 33. If this current should be greater than a desired value which may damage transistors 4 and 5, the voltage developed across resistor 33 causes the Zener diode 8 to conduct, and effectively connect the base bias network to the output terminal 34. The polarity of the voltage developed across the resistor 33 will depend upon which transistor is driving the load at that time.

To illustrate the foregoing, it may be presumed that the transistors 4 and 5 are silicon transistors and that the voltage drop across each of the resistors 23 and 32 is about 0.6 volts. Thus, under no signal conditions the voltage drop across the resistor 32 is equal to the voltage drop across the base-emitter junction of the transistor 5. A similar condition holds with respect to the voltages across the resistor 23 and the base-emitter junction of transistor 4. Since no current is flowing in the load and the resistor 33, the net voltage across the Zener diode 8 is zero. Under normal drive conditions, the transistors 4 and 5 will not cause more than about 0.6 volts to be developed across the resistor 33. Under overload conditions, such as when the output terminal 34 is shorted to ground, the voltage across the resistor 33 will tend to exceed 0.6 volts at which time the diode 8 conducts in the forward direction. Tracing the voltages around the loop including the resistor 33, the base-emitter diode of the transistor 5, the resistor 32, and the Zener diode 8, it will be seen that the diode 8 is biased 0.6 volts in the forward direction and will conduct, clamping the signal drive to ground to limit the overload current.

On opposite half cycles where the transistor 4 supplies current to the load, the voltage developed across the resistor 33 in response to overload conditions provides a reverse bias on the Zener diode 8. If the Zener diode exhibits symmetrical forward and reverse conductivity characteristics or if two conventional diodes wired in parallel and oppositely poled are used, then the signal drive will be limited in a manner corresponding to that described above. As a practical matter, the Zener diode may not exhibit symmetrical conductivity characteristics in the forward and reverse directions, and therefore a larger voltage must be developed across the resistor 33 before the Zener diode 8 conducts in its reverse bias direction.

The fact that the Zener diode 8 may not have symmetrical conductivity characteristics in the forward and reverse directions is not a serious problem since it is more important to provide overload protection for the transistor 5 than for the transistor 4. When the signal drive conditions are such that the transistor 3 is driven toward cutoff the transistor 4 is driven into greater conduction. It will be noted that, that portion of the biasing network including the resistors 21 and 22 limit the maximum base-emitter current of the transistor 4, and by proper design of this resistance value, the transistor 4 can be protected against overload conditions. However, when the transistor 3 is driven toward saturation, the transistor 4 is cutoff and the transistor 5 is driven toward greater conduction. Under these conditions the impedance looking into the base electrode of the transistor 5 is very small and under overload conditions the base drive signal from transistor 3 is sufficient to cause excessive transistor 5 current. Accordingly, although the Zener diode 8 as connected in the circuit of FIG. 1 provides protection for both transistors 4 and 5, it will be understood that a conventional rectifier or diode poled as shown may be substituted therefor to provide protection for transistor 5 only.

In addition to the protection afforded by the Zener diode 8 clamping the input signal level to the transistors 4 and 5, the negative current feedback effect of the resistor 33 is enhanced to further degenerate any increase in current through transistors 4 and 5. This occurs when the Zener diode conducts because the effective impedance of the driving circuit for the transistors 4 and 5 is greatly reduced, and becomes a low impedance path for the negative current feedback from resistor 33. Thus, incremental changes in the voltage across the resistor 33 have a greater effect on transistor current when the Zener diode conducts than when the driving source impedance is higher.

FIG. 2 is a schematic circuit diagram of a direct coupled quasi-complementary symmetry 60 watt power amplifier incorporating the invention. The quasi-complementary symmetry design is generally equivalent to the complementary symmetry design shown in FIG. 1.

Signal driver transistors 2 and 3 in FIG. 2 provide an equivalent driver function for the quasi-complementary outputs 4, 5, 6 and 7 as driver stage 3 did in FIG. 1. The output transistors 4 and 6 in FIG. 2 provide a function similar to that of transistor 4 of FIG. 1. Similarly, the two output transistors 5 and 7 in FIG. 2 operate functionally equivalent to transistor 5 in FIG. 1. The single current sampling resistor 33 in FIG. 1 has been replaced by separate resistors 17 and 18 in FIG. 2. This provides increased direct current operating point stability by degenerating emitter current within the input circuit bias voltage loop. Also the increase in output impedance because of the presence of the current sampling resistors 17 and 18 is reduced because it is now included within the feedback loop. The resistors 17 and 18 provide a voltage proportional to transistor current rather than current the transistor contributes to the load. The bias network for the transistors 4 and 5 includes three silicon diodes 9*a*, 9*b* and 9*c* which provide a voltage drop inversely proportional to temperature to obtain a temperature compensation of the quiescent current operating point of the output transistors.

The Zener diode 8 in this circuit is connected from the output terminal 34 to the connection between diodes 9*b* and 9*c*. When the signal drive from driver transistor 3 swings negative, current to the load flows through resistor 18, and if the current is excessive, sufficient voltage will be produced across the resistor 18 to cause forward conduction in the Zener diode 8, thereby bypassing excess negative drive signals to the output terminal. Similarly when the signal drive from drive transistor 3 is positive, current to the load will flow in resistor 17, and if it is excessive, it will produce a voltage to cause the Zener diode 8 to conduct in the Zener breakdown mode, bypassing positive drive signals to the output terminal. In this way excess signal drive, whatever its cause, is shunted to the output terminal 34 for both positive and negative signal swings to limit current in the output transistors.

The Zener diode used may have, by way of example, a low forward conduction drop of approximately 0.6 volt, and a relatively high reverse conduction drop of 4.5 volts. The diode used in the embodiment shown has a reverse conduction characteristic showing a gradual increase in current flow starting below 3.3 volts bias.

The quiescent current of the output transistors 6 and 7 is relatively low, such as 20 milliamperes, and therefore little voltage drop is developed across the resistors 17 and 18 which typically may have a resistance value of 0.3 ohm. The voltage drop across each of the base-emitter junctions of transistors 4, 5, 6 and 7 and across each of the diodes 16, 9*a*, 9*b* and 9*c* is approximately 0.6 volt. The potentiometer 23, used to adjust the output transistors 6 and 7 quiescent current, generally has a voltage drop of 0.6 volt. These voltage drops contribute to produce a reverse bias of approximately 0.6 volt on the Zener diode 8.

The point of connection of the Zener diode 8 to the diode chain 9*a*, 9*b* and 9*c* places a reverse bias on the diode at quiescent conditions and also permits adjusting the limiting currents in transistors 6 and 7 to equal values. The voltage drops in the bias loop when limiting occurs can be traced if the amplifier is operated with a sine wave input signal and a short circuit load. By way of example, when transistor 7 is supplying current to the load through resistor 18, a 5 ampere limit current would produce a 1.5 volt drop in the 0.3 ohm resistor 18. Simultaneously transistor 5 would have a base-to-emitter drop of typically 0.7 volt resulting in −2.2 volt on the base of that transistor. Current limiting would occur in this condition because diodes 9*a*, 9*b*, and Zener diode 8 would all be in forward conduction having approximately 0.75, 0.75, and 0.7 volts across them respectively. Therefore negative signal drive from transistor 3 is shunted by the diodes to the output terminal. Conversely for alternate half cycles when transistor 6 is supplying limit current to the load through resistor 17, 5 amperes would produce a 1.5 volt drop in the 0.3 ohm resistor 17. The base emitter voltage drops of transistors 4 and 6 typically might be 0.8 and 0.9 volt respectively at this time and the forward voltage drop of the diode 16 would be approximately 1.0 volt. This would then result in a cumulated voltage at the base of transistor 4 of +4.2 volts. When the voltage at the base of transistor 4 reaches 4.2 volts then conduction also occurs through the potentiometer 23, diode 9*c*, and Zener diode 8 to the output terminal. The corresponding voltage drops are 0.3, 0.6, and 3.3 volts respectively. The current in this path is small, typically 3 to 4 milliamperes, and is that bias current supplied by resistor 22 minus the drive current supplied to the base of transistor 4. The connection of the Zener diode 8 to the bias diode chain 9*a*, 9*b*, 9*c* can therefore be selected to equalize the limit currents in the output transistors even though the Zener diode conduction characteristic is not symmetrical for both directions of current flow.

Another embodiment of this invention uses a conventional diode in substitution for the Zener diode 8 polarized as shown in FIG. 2 to provide current limit protection for transistors 5 and 7. For example a silicon diode polarized and connected the same as the Zener diode 8 provides protection limiting with the same voltage drop and therefore the same current threshold for the transistors 5 and 7. The transistors 4 and 6 in such a circuit are protected by proper design of the biasing circuit. The maximum signal available to drive transistor 4 and transistor 6 occurs when driver transistor 3 is cutoff and bias current through resistor 22 flows into the base of transistor 4. It then is possible to adjust the resistor 22 bias current, by an appropriate choice of resistors 21 and 22 and the quiescent current of transistor 3, to a suitable value sufficient to drive transistor 4 and therefore also driving transistor 6 to a design limit value and thereby protect transistor 6 against excess currents. In this way transistors 5 and 7 are protected against excess current by a conventional diode and transistors 4 and 6 are protected by the appropriate choice of circuit parameters.

What is claimed is:

1. A protection circuit for an electrical signal amplifier comprising in combination first and second opposite conductivity transistors each having a base, emitter, and collector electrodes;

a signal input circuit;

means coupling said signal input circuit to the base electrodes of said transistors including common signal coupling means connected between the base electrodes of said transistors;

an output circuit;

means coupling said emitters to said output circuit including a current sampling impedance in the current path of at least one of said emitters;

electronic switch means coupled between said common signal coupling means and said output circuit to form a circuit loop including said emitter, said current sampling impedance and said electronic switch means, said switch means being responsive to voltage developed across said current sampling impedance to provide a low impedance path between said common signal coupling means and said output circuit when said voltage exceeds a threshold value.

2. A protection circuit as defined in claim 1 wherein the current sampling impedance is a resistor.

3. A protection circuit as defined in claim 1 wherein said electronic switch means is a diode which provides said low impedance path when a threshold voltage is exceeded for at least one polarity of applied voltage.

4. A protection circuit as defined in claim 3 wherein said signal input circuit includes a driver transistor having a collector electrode connected in common to the base electrodes of said first and second transistors, and being of the same conductivity type as said second transistor, and wherein said diode is poled to be driven toward forward current conduction by current flow between the emitter and collector electrodes of said first transistor.

5. A protection circuit as defined in claim 4 wherein said diode comprises a Zener diode.

6. A protection circuit as defined in claim 2 including a third and fourth transistor of the same conductivity type as said second transistor;

means connecting the emitter electrode of said second transistor to the base electrode of said third transistor;

means connecting the collector electrode of said first transistor to the base electrode of said fourth transistor;

said resistor being in series with the collector-to-emitter current path of one of said third and fourth transistors.

7. A protection circuit as defined in claim 6 including a second current sampling impedance means which comprises a second resistor in series with the other of said third and fourth transistor emitter collector current paths and said electronic switch means is a bidirectionally conductive device conducting current when a threshold voltage is exceeded for each polarity of applied voltage.

8. A transistor amplifier circuit including first and second opposite conductivity transistors each having base, emitter and collector electrodes;

a driver transistor having base, emitter and collector electrodes and being of the same conductivity type as said second transistor;

signal input circuit coupled between the base and emitter electrodes of said driver transistor;

means connecting the collector electrode of said driver transistor to the base electrode of said first transistor;

a common impedance element connected between the base electrodes of said first and second transistors;

a pair of output terminals;

means including at least one resistor connecting one of said output terminals to the emitter electrode of one of said first and second transistors and a diode connected between said one of said output terminals and the common impedance element, said diode being poled in a direction such that current from said first transistor through said resistor tends to forward bias said diode.

9. An amplifier circuit comprising:

a driver transistor of a first conductivity type having base, emitter and collector electrodes;

a signal input circuit coupled between the base and emitter electrodes of said driver transistor;

first, second and third transistors each having base, emitter and collector electrodes and being of the same conductivity type as the driver transistor, a fourth transistor having base, emitter and collector electrodes and being of a conductivity type opposite of that of said driver transistor;

means connecting the collector electrode of said driver transistor to the base electrode of said fourth transistor;

a resistive means and first, second and third rectifier devices connected in the order named between the base electrode of said first transistor and base electrode of said fourth transistor;

means connecting the emitter electrode of said first transistor to the base electrode of said second transistor;

means connecting the collector electrode of the fourth transistor to the base electrode of the third transistor;

a pair of output terminals;

a fourth rectifier device and second resistive means connected between the emitter electrode of the second transitor and one of said output terminals;

third resistive means connected between the collector electrode of the third transistor and said one of said pair of output terminals;

a diode connected between said one of said output terminals and the junction of said first and second rectifier devices;

said diode being poled in a direction such that an increase in the voltage drop across said third resistive element tends to bias said diode in a forward direction.

* * * * *

Disclaimer

3,796,967.—*Jack C. Sondermeyer,* S. Somerville, N. J. AMPLIFIER PROTECTION CIRCUIT. Patent dated Mar. 12, 1974. Disclaimer filed June 2, 1981, by the assignee, *RCA Corp.*

Hereby enters this disclaimer to claims 1, 2, 3, 4 and 5 of said patent.

[*Official Gazette November 24, 1981.*]